(12) United States Patent
Zang et al.

(10) Patent No.: US 10,797,049 B2
(45) Date of Patent: Oct. 6, 2020

(54) FINFET STRUCTURE WITH DIELECTRIC BAR CONTAINING GATE TO REDUCE EFFECTIVE CAPACITANCE, AND METHOD OF FORMING SAME

(71) Applicant: GLOBALFOUNDRIES INC., Grand Cayman (KY)

(72) Inventors: Hui Zang, Guilderland, NY (US); Haiting Wang, Clifton Park, NY (US); Chung Foong Tan, Ballston Spa, NY (US); Guowei Xu, Ballston Lake, NY (US); Ruilong Xie, Niskayuna, NY (US); Scott H. Beasor, Greenwich, NY (US); Liu Jiang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/170,117

(22) Filed: Oct. 25, 2018

(65) Prior Publication Data

US 2020/0135723 A1    Apr. 30, 2020

(51) Int. Cl.
| | |
|---|---|
| *H01L 27/088* | (2006.01) |
| *H01L 29/08* | (2006.01) |
| *H01L 29/66* | (2006.01) |
| *H01L 29/51* | (2006.01) |
| *H01L 21/8234* | (2006.01) |
| *H01L 29/49* | (2006.01) |
| *H01L 29/78* | (2006.01) |

(52) U.S. Cl.
CPC .. *H01L 27/0886* (2013.01); *H01L 21/823431* (2013.01); *H01L 21/823468* (2013.01); *H01L 21/823481* (2013.01); *H01L 29/0847* (2013.01); *H01L 29/4966* (2013.01); *H01L 29/51* (2013.01); *H01L 29/66545* (2013.01); *H01L 29/785* (2013.01)

(58) Field of Classification Search
CPC ............ H01L 27/0886; H01L 29/0847; H01L 21/823431; H01L 21/823481; H01L 21/823468; H01L 29/66545; H01L 29/785; H01L 29/4966; H01L 29/51
See application file for complete search history.

(56) References Cited

U.S. PATENT DOCUMENTS

| | | | |
|---|---|---|---|
| 8,963,257 B2 * | 2/2015 | Wann | H01L 21/2236 257/401 |
| 9,245,883 B1 | 1/2016 | Lin et al. | |
| 2015/0129934 A1 | 5/2015 | Xie et al. | |
| 2016/0111336 A1 | 4/2016 | Chang et al. | |
| 2016/0233298 A1 | 8/2016 | Webb et al. | |
| 2019/0067027 A1 * | 2/2019 | Wang | H01L 21/31051 |
| 2019/0067284 A1 * | 2/2019 | Ching | H01L 27/0924 |

(Continued)

*Primary Examiner* — Victor A Mandala
(74) *Attorney, Agent, or Firm* — Francois Pagette; Hoffman Warnick LLC (57) ABSTRACT

A FinFET structure having reduced effective capacitance and including a substrate having at least two fins thereon laterally spaced from one another, a metal gate over fin tops of the fins and between sidewalls of upper portions of the fins, source/drain regions in each fin on opposing sides of the metal gate, and a dielectric bar within the metal gate located between the sidewalls of the upper portions of the fins, the dielectric bar being laterally spaced away from the sidewalls of the upper portions of the fins within the metal gate.

17 Claims, 6 Drawing Sheets

(56) References Cited

U.S. PATENT DOCUMENTS

| | | | |
|---|---|---|---|
| 2019/0067417 A1* | 2/2019 | Ching | H01L 29/0847 |
| 2019/0067444 A1* | 2/2019 | Ching | H01L 21/02532 |
| 2019/0386002 A1* | 12/2019 | Wu | H01L 21/823431 |
| 2020/0006075 A1* | 1/2020 | Wang | H01L 27/0886 |
| 2020/0006334 A1* | 1/2020 | Hsueh | H01L 21/31116 |
| 2020/0058508 A1* | 2/2020 | Yu | H01L 21/76897 |
| 2020/0075423 A1* | 3/2020 | Kwok | H01L 29/66795 |
| 2020/0126998 A1* | 4/2020 | Zhou | H01L 29/6656 |
| 2020/0144423 A1* | 5/2020 | Chu | H01L 29/167 |

* cited by examiner

FINFET STRUCTURE WITH DIELECTRIC BAR CONTAINING GATE TO REDUCE EFFECTIVE CAPACITANCE, AND METHOD OF FORMING SAME

TECHNICAL FIELD

The subject matter disclosed herein relates to FinFET structures containing a dielectric bar within the gate area. More specifically, various aspects described herein relate to FinFET structures containing a dielectric bar within the gate area and having reduced effective capacitance, and methods of forming the same.

BACKGROUND

With complementary metal-oxide semiconductor (CMOS) technology continuously scaling down, the three-dimensional (3-D) fin field-effect transistor (FinFET) device has become the mainstream device due to its better electro-static control and reduced junction capacitance. The 3-D structure provides a new electric field distribution in the channel and improves the current-voltage characteristic curves. But, it also complicates the parasitic capacitance of the FinFET device. More specifically, as FinFET devices scale down, the gate-to-contact parasitic capacitance gradually dominates the total capacitance of the device.

BRIEF SUMMARY

FinFET structures containing a dielectric bar within the gate area and having reduced effective capacitance and methods of forming the same are disclosed. In a first aspect of the disclosure, a FinFET structure includes: a substrate having at least two fins thereon laterally spaced from one another; a metal gate over fin tops of the at least two fins and between sidewalls of upper portions of the at least two fins; source/drain regions in each fin on opposing sides of the metal gate; and a dielectric bar within the metal gate located between the sidewalls of the upper portions of the at least two fins, the dielectric bar being laterally spaced away from the sidewalls of the upper portions of the at least two fins within the metal gate.

In a second aspect of the disclosure, a method of making a FinFET structure includes: forming a dielectric spacer on each sidewall of an upper portion of at least two semiconductor fins laterally spaced from one another on a substrate; forming a dielectric bar between sidewalls of adjacent dielectric spacers; removing the dielectric spacers; and forming a metal gate over fin tops of the at least two fins, over the dielectric bar, and on the sidewalls of the upper portions of the at least two fins, the at least two fins having source/drain regions therein adjacent the metal gate.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The subject matter disclosed herein relates to FinFET structures containing a dielectric bar within the gate area. More specifically, various aspects described herein relate to FinFET structures containing a dielectric bar within the gate area and having reduced effective capacitance, and methods of forming the same.

As noted above, conventional scaled down FinFETs (such as 14 nm and beyond) can suffer from excessive gate-to-contact parasitic capacitance which can significantly increase an integrated circuit's (IC) effective capacitance ($C_{eff}$) and thus degrade chip performance. In contrast, various aspects of the disclosure include FinFET structures containing one or more dielectric bars within the gate area that allow for reduced gate-to-contact parasitic capacitance which in turn allows for reduced effective capacitance of an IC and improved device performance.

Figure 1:
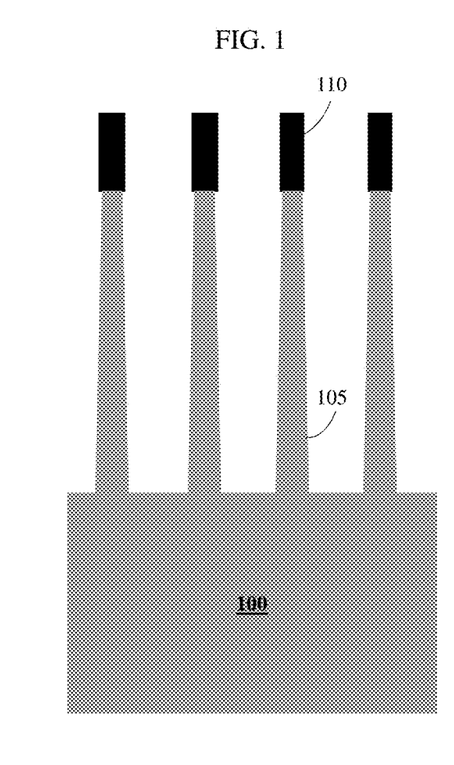
FIG. 1 shows a schematic cross-section of a FinFET structure after fin formation.

FIG. 1 depicts a starting precursor FinFET structure that may be formed by any now known or later developed manufacturing techniques. The precursor structure includes a substrate 100. Substrate 100 can be composed of any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Substrate 100 may include fins 105 positioned thereon and laterally spaced from one another. Although four fins are shown, any desirable number of fins for a semiconductor device may be used. Fins 105 may be formed by any now known or later developed semiconductor fabrication techniques for forming a fin on a substrate. For example fins 105 may be formed by patterned epitaxial growth of substrate 100 or, as shown in FIG. 1, patterned etchings of substrate 100 using a mask 110. Mask 110 can include any mask material appropriate for the desired etching, for example SiN, SiBCN, SiNC, $Si_3N_4$, SiCO, $SiO_2$ and/or SiNOC.

"Epitaxy" or "epitaxial growth," as used herein, refers to a process by which a thin layer of single-crystal or large-grain polycrystalline material is deposited on a base material with similar crystalline properties. Etching generally refers to the removal of material from a substrate (or structures formed on the substrate), and is often performed with a mask in place so that material may selectively be removed from certain areas of the substrate, while leaving the material unaffected, in other areas of the substrate.

Regarding the mentioned etching, there are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches.

Figure 2:
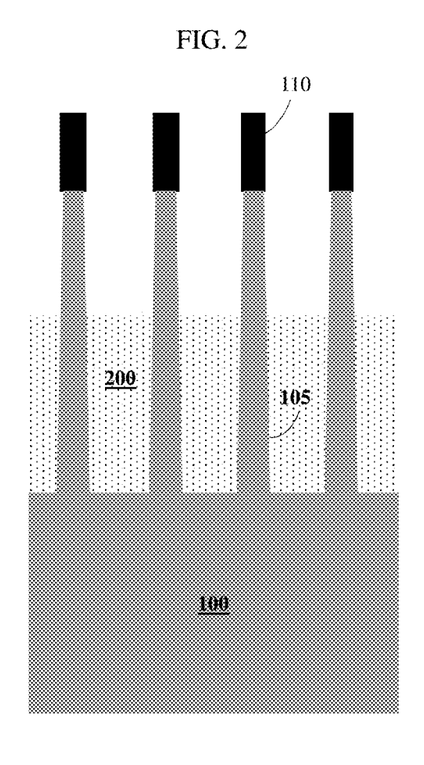
FIG. 2 shows a schematic cross-section of a FinFET structure after shallow trench isolation (STI) formation and fin reveal.

FIG. 2 depicts a shallow trench isolation (STI) layer 200 formed on substrate 100 adjacent to fins 105. As shown in FIG. 2, STI layer 200 may be formed on a bottom portion of the sidewalls of fins 105. STI layer 200 may, for example, electrically isolate fins 105 from one another and other semiconductor structures on substrate 100. STI layer 200 may include but is not limited to: silicon monoxide (SiO), silicon dioxide (SiO2), and/or any another now known or later developed oxide materials.

STI layer 200 may be formed on substrate 100 adjacent to fins 105 by conventional semiconductor fabrication techniques for forming an STI dielectric layer. For example, after the formation of fins 105 on substrate 100, STI layer 200 may be formed by deposition, chemical mechanical planarization (CMP) and etching. After etching STI layer 200, an upper portion of fins 105, i.e., an active region of fins 105, may be re-exposed since STI layer 200 has a top surface below a top surface of fins 105 after etching.

As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Figure 3:
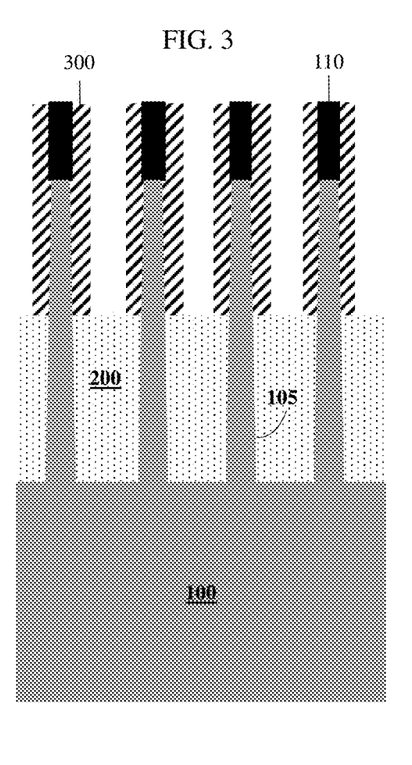
FIG. 3 shows a schematic cross-section of a FinFET structure after dielectric spacer formation.

FIG. 3 depicts a dielectric spacer 300 formed on STI layer 200 and sidewalls of fins 105. More specifically, and as shown in FIG. 3, dielectric spacer 300 may be formed on each sidewall of an upper portion of fins 105. Dielectric spacers 300 may, for example, provide lateral spacing for a dielectric bar (discussed below) formed between fins 105. Dielectric spacer material constituting spacers 300 may include, but is not limited to: aluminum oxide ($Al_2O_3$), silicon mononitride (SiN), aluminum nitride (AlN) and hafnium dioxide ($HfO_2$; also known as hafnium(IV) oxide), or combinations thereof.

Spacers 300 may be formed by conventional semiconductor fabrication techniques for forming dielectric spacers. For example, spacers 300 may be formed by deposition of dielectric spacer material on STI layer 200 followed by anisotropic etching (e.g., anisotropic RIE) of the dielectric spacer material between adjacent fins 105 such that spacers 300 are formed on each sidewall of the upper portion of fins 105. As shown in FIG. 3, after the noted anisotropic etching, space exists between sidewalls of adjacent spacers 300 in order to allow for subsequent dielectric bar formation (discussed below). As also shown in FIG. 3, the noted anisotropic etching may, for example, result in portions of a top surface of STI layer 200 between adjacent spacers 300 to be exposed. Spacers 300 may have a thickness of approximately 3.5 nanometers (nm) to approximately 10 nanometers (nm), or may have a thickness of approximately 5 nanometers (nm) to approximately 10 nanometers (nm).

Figure 4:
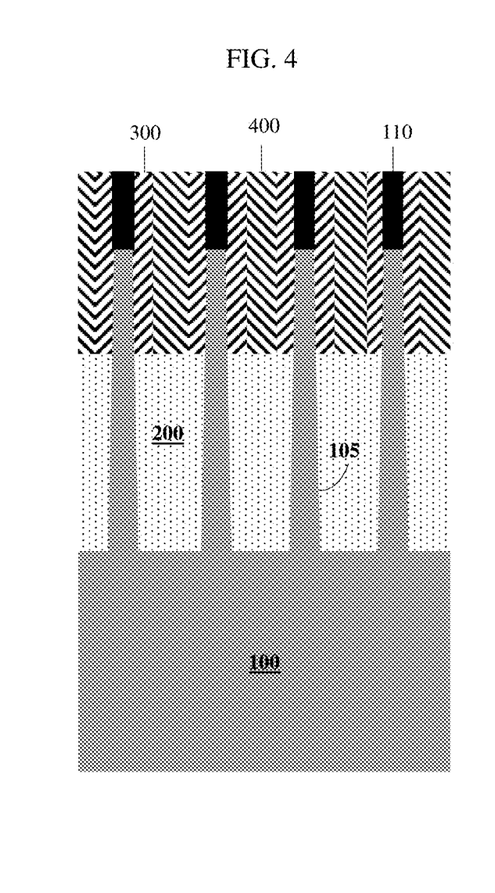
FIG. 4 shows a schematic cross-section of a FinFET structure after dielectric bar material deposition.
Figure 5:
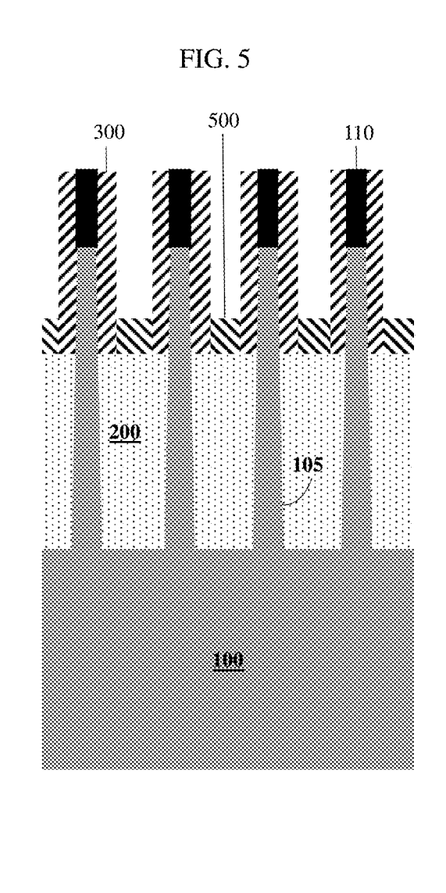
FIG. 5 shows a schematic cross-section of a FinFET structure after dielectric bar material recess.

FIG. 4 depicts the result of an initial step in the ultimate formation of a dielectric bar 500 (FIG. 5). This initial step as depicted in FIG. 4 includes, for example, depositing a dielectric bar material 400 on the exposed top surface of STI layer 200 between adjacent spacers 300 and between sidewalls of adjacent spacers 300. Dielectric bar material 400 may include, but is not limited to: carbosiloxane (SiOC) and silicon carbide (SiC), or combinations thereof. After the deposition, dielectric bar material 400 may be planarized, for example by chemical mechanical planarization (CMP). As shown in FIG. 4 for example, the planarization may be performed such that a top surface of dielectric material 400 is substantially coplanar with a top surface of mask 110 atop fins 105.

FIG. 5 depicts the result of completion of dielectric bar 500 formation. More specifically, dielectric bar 500 may be recessed such that the top surface thereof is below a top surface of fins 105 as shown in FIG. 5 (or, in other words, below a bottom surface of mask 110 atop fins 105). The recessing of dielectric bar 500 may be accomplished by etching, for example, RIE. As can be seen in FIG. 5, dielectric bar 500 is laterally spaced from a given sidewall of an upper portion of a given fin 105 by a thickness of a given spacer 300. As noted above, this thickness may be approximately 3.5 nm to approximately 10 nm. Dielectric bar 500 of FIG. 5 is depicted as being located on portions of the top surface of STI layer 200. However, in some instances the dielectric spacer material of dielectric spacers 300 may remain present between a bottom surface of dielectric bar 500 and the top surface of STI layer 200.

Figure 6:
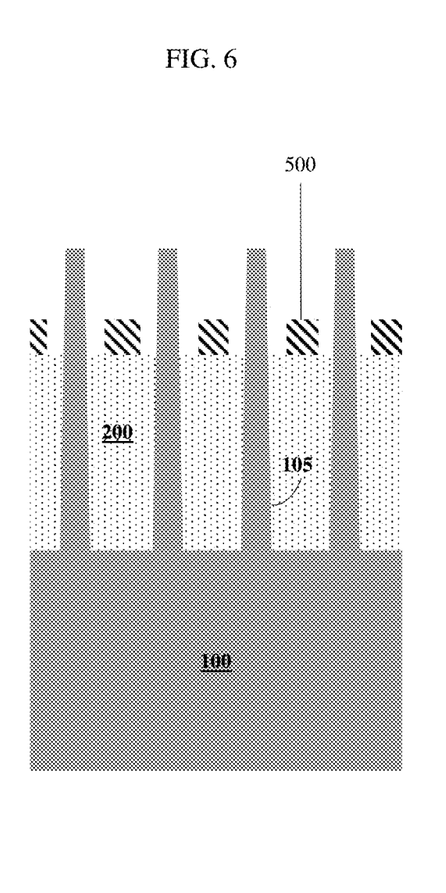
FIG. 6 shows a schematic cross-section of a FinFET structure after spacer removal.

FIG. 6 depicts the result of the removal of spacers 300. For example, spacers 300 may be removed by etching, for instance wet etching of the dielectric spacer material constituting spacers 300. FIG. 6 also depicts removal of mask 110 over fins 105. This double removal of both spacers 300 and mask 110 can be accomplished by a wet etching technique that is chosen to selectively dissolve the materials of spacers 300 and mask 110 while leaving the materials of dielectric bar 500, fins 105 and STI layer 200 relatively intact. While FIG. 6 depicts an embodiment where fins 105 are equally spaced from one another and each dielectric bar 500 appears uniformly sized, this is not required to adhere to the essence of this disclosure.

Figure 7:
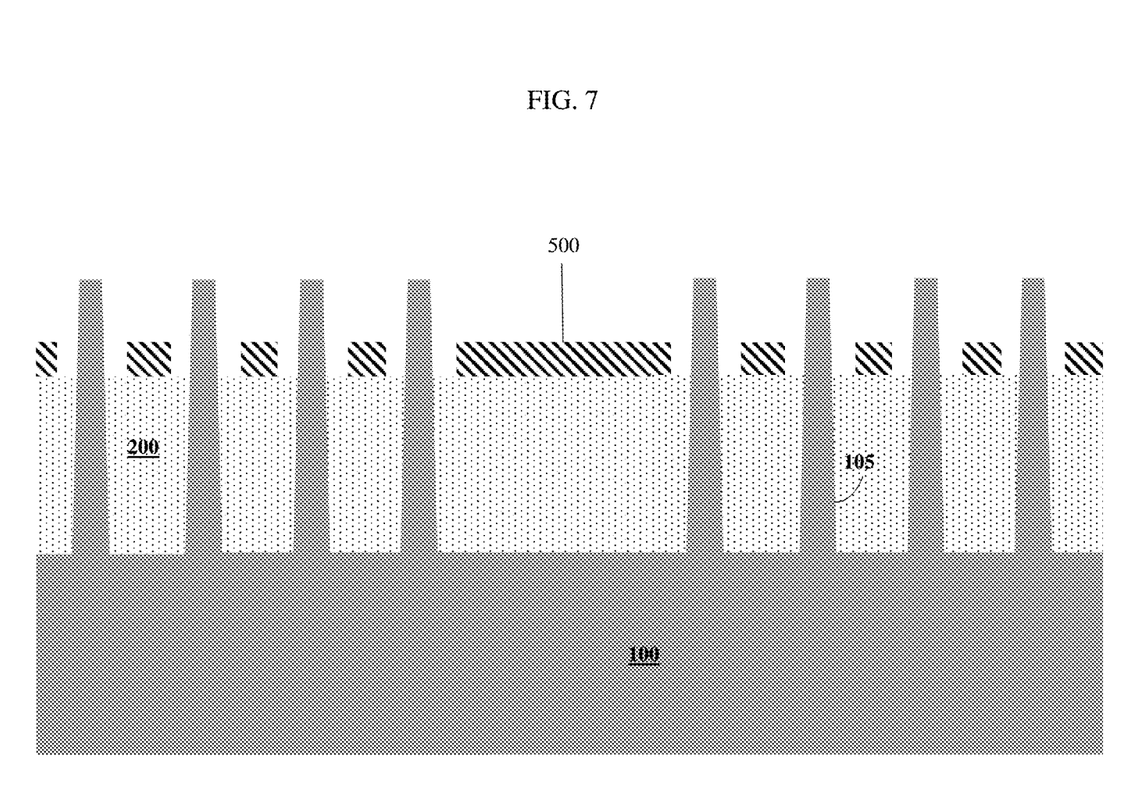
FIG. 7 shows a schematic cross-section of an alternate FinFET structure after spacer removal.

FIG. 7 depicts an alternate embodiment of the disclosure where not all fins 105 are equally spaced and not all dielectric bars 500 are the same size. The alternate embodiment of FIG. 7 is the result of the above-discussed formation steps, concluding with removal of spacers 300. This alternate embodiment as shown in FIG. 7 will be the basis for the remaining FIGS. 8-10 which, as discussed below, depict metal gate and gate cut isolation formation.

Figure 8:
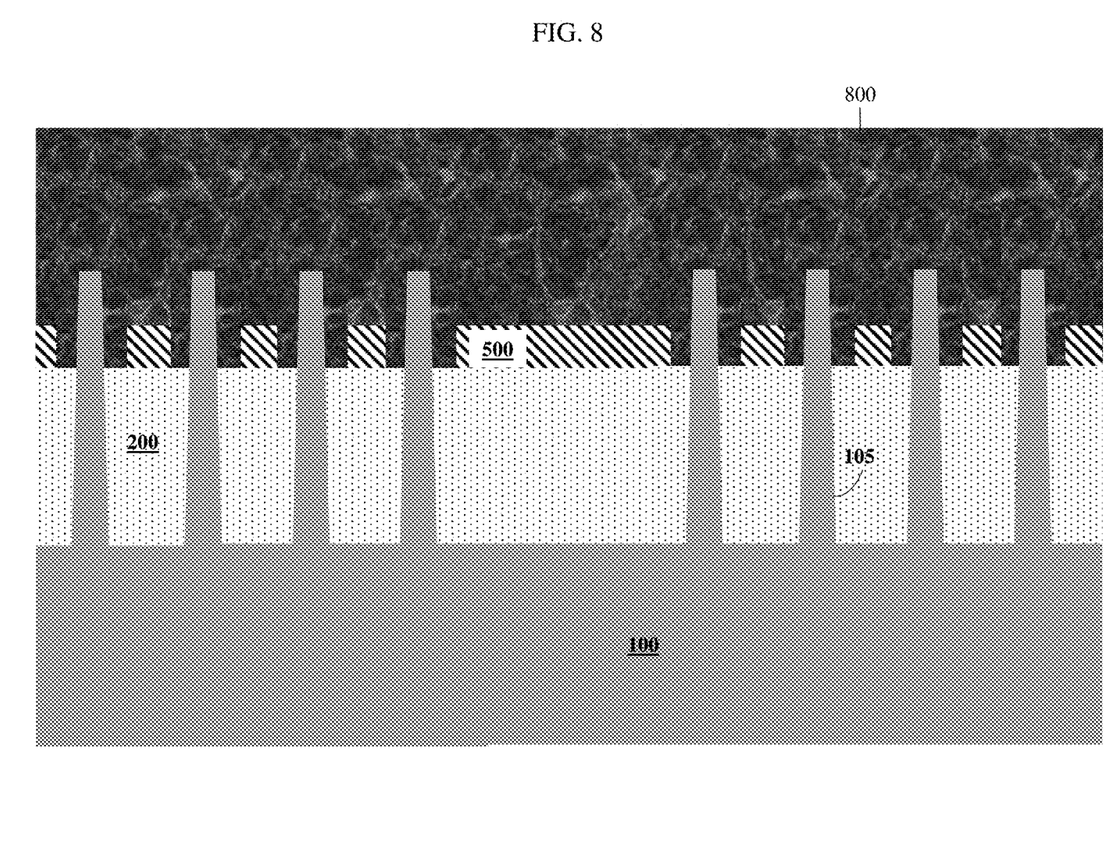
FIG. 8 shows a schematic cross-section of a FinFET structure after dummy gate material deposition.

FIG. 8 depicts a dummy gate structure 800 formed over the top of the structure of FIG. 7. Dummy gate structure 800 may be formed, for example, by depositing a sacrificial material over tops of fins 105, over dielectric bars 500, and on sidewalls of upper portions of fins 105. The sacrificial material constituting dummy gate 800 may include, but is not limited to: polysilicon and amorphous silicon, or combinations thereof. After the deposition, dummy gate structure 800 may be planarized, for example by chemical mechanical planarization (CMP). While not depicted in FIG. 8, as understood in the art, fin portions located on opposing sides of dummy gate structure 800 (i.e., portions projecting into and out of the page) may be exposed, e.g., by a patterned etch of sacrificial material, and source/drain regions may be formed in the fins, e.g., by ion implantation and an anneal.

Figure 9:
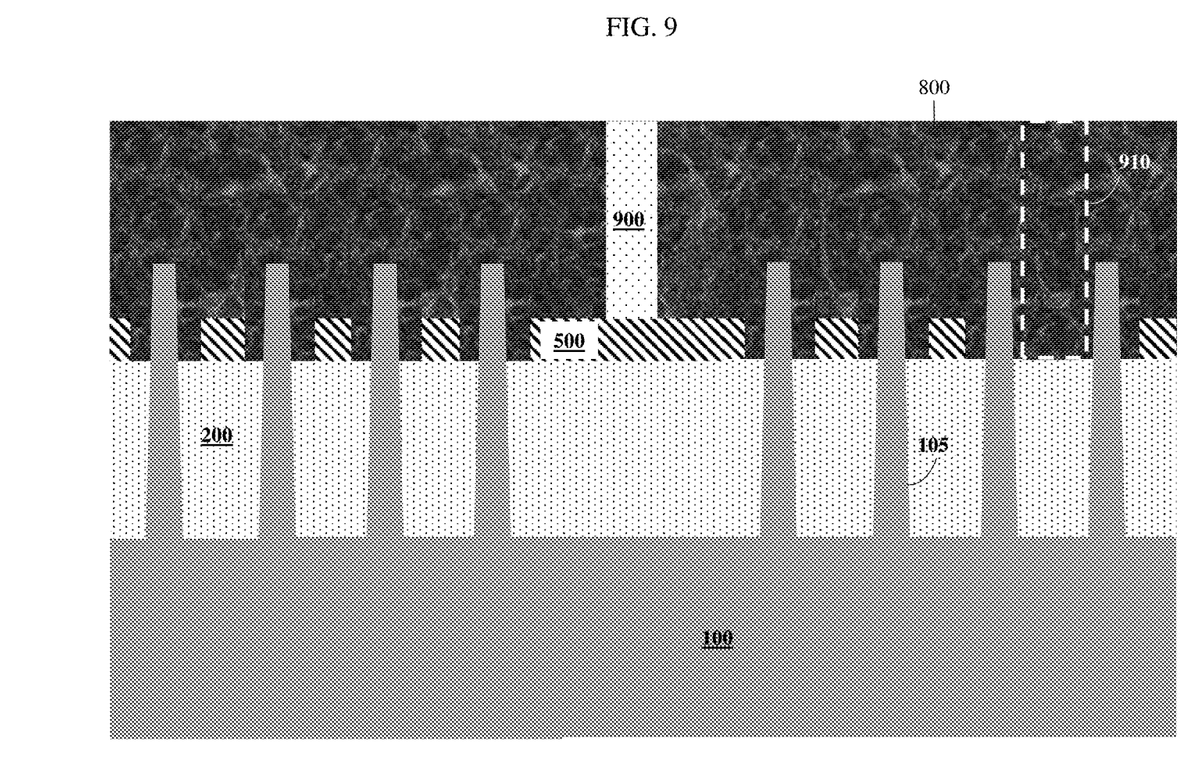
FIG. 9 shows a schematic cross-section of a FinFET structure after gate cut isolation formation.

FIG. 9 depicts a gate cut isolation 900 within dummy gate structure 800. Gate cut isolation 900 may be formed by conventional semiconductor fabrication techniques for forming a gate cut and a gate cut isolation. More specifically, gate cut isolation 900 may be formed by etching a portion of dummy gate structure 800, thereby forming a gate cut (sometimes called a gate cut cavity), and subsequently filling the gate cut cavity with a dielectric material, thereby forming gate cut isolation 900. The dielectric material of gate cut isolation 900 may be any one or more of the dielectric materials mentioned herein.

As shown in FIG. 9, gate cut isolation 900 may extend from a portion of the top surface of dummy gate structure 800 to at least a portion of the top surface of dielectric bar 500 thereunder. As can also be seen from FIG. 9, gate cut isolation 900 that extends to the top surface of dielectric bar 500 has a depth that is less than a distance from the top surface of dummy gate structure 800 to the top surface of STI layer 200. This decreased depth of gate cut isolation 900, due to a decreased etch depth of the gate cut in light of the presence of dielectric bar 500, results in a benefit to the resulting FinFET structure in that the gate cut has an improved (e.g., lower) aspect ratio. In other words, the gate cut and resulting gate cut isolation 900 may have a more desirable critical dimension (i.e., smaller width).

While gate cut isolation 900 is depicted in FIG. 9 as having a width less than a width of dielectric bar 500 thereunder (and forming an inverse "T" shape), it is noted that gate cut isolation 900 may have a width equal to or greater than a width of dielectric bar 500 thereunder (and thus may form alternate shapes). Regardless of the width relationship between gate cut isolation 900 and dielectric bar 500, the width of the gate cut cavity resulting in gate cut isolation 900 that extends to the top surface of dielectric bar 500 may be smaller than a width of another (potential) cavity 910 (shown in phantom via dotted outline) formed by etching another portion of dummy gate structure 800 with an etch depth equal to or greater than the distance from the top surface of dummy gate structure 800 to the top surface of STI layer 200.

Figure 10:
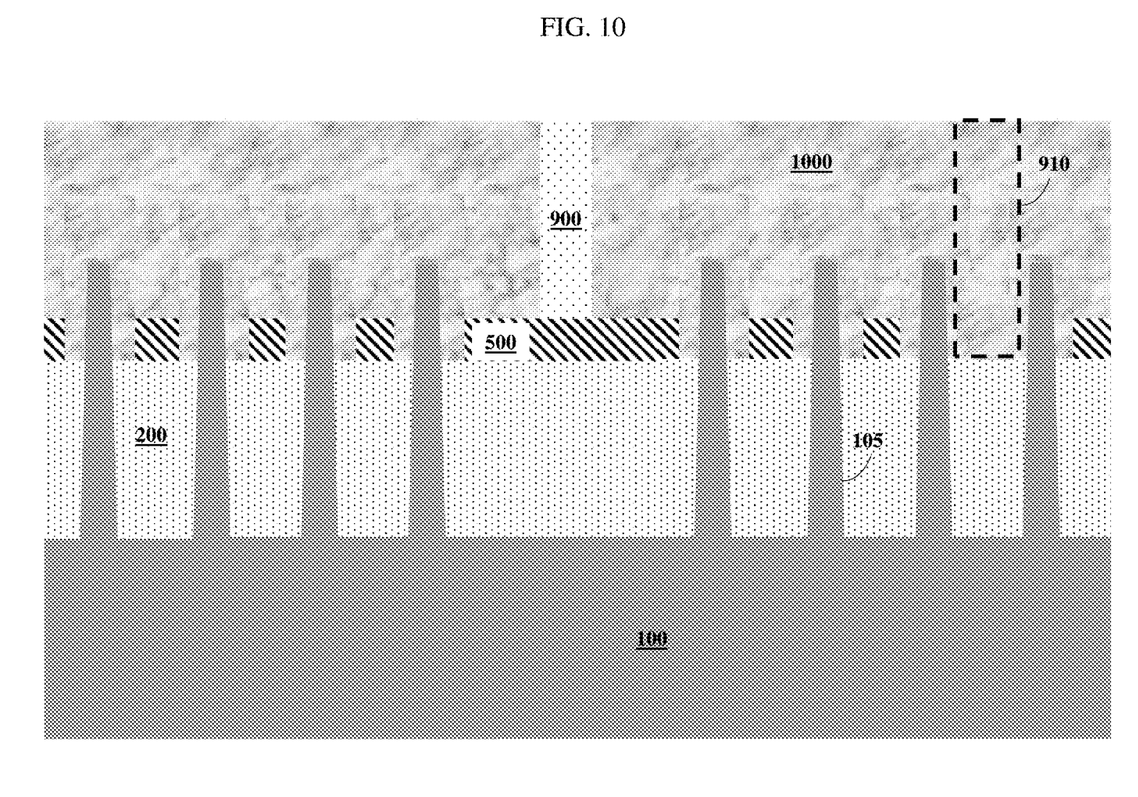
FIG. 10 shows a schematic cross-section of a FinFET structure after replacement metal gate formation.

FIG. 10 depicts a metal gate 1000 formed in place of dummy gate structure 800 of FIG. 9. More specifically, FIG. 10 depicts the result of forming metal gate 1000, for instance by removing dummy gate structure 800 and depositing metal gate 1000 material over tops of fins 105, over dielectric bars 500, and on sidewalls of upper portions of fins 105 such that a top surface of metal gate 1000 is above tops of fins 105. Metal gate 1000 can comprise various films and can be different for different types of devices (e.g., NFET, PFET, etc.). The material of metal gate 1000 can be, for example, any suitable high-k dielectric material, for example, $HfO_2$ and $ZrO_2$. The metal gate 1000 can comprise a work function metal such as TiN, TiC, TiAl, TaN, etc., and can further comprise one or more low resistance conducting metals such as W, Co and Ru.

As can be seen in FIG. 10, metal gate 1000 having dielectric bars 500 therein has a vertical cross-sectional area that is less than a vertical cross-sectional area of a similar metal gate without dielectric bar(s) therein. In other words, the vertical cross-sectional area of metal gate 1000 is reduced by an amount equal to a vertical cross-sectional area of dielectric bars 500 within metal gate 1000. This reduced cross-sectional area of metal gate 1000, due to the presence of dielectric bars 500, results in an additional benefit to the corresponding FinFET structure in that the gate-to-contact parasitic capacitance is reduced which in turn provides improved/reduced effective capacitance ($C_{eff}$) of the resulting FinFET device.

The $C_{eff}$ of the resulting FinFET device is reduced by an amount proportional to the vertical cross-sectional area of dielectric bars 500 within metal gate 1000. This reduction in effective capacitance being proportional to the area of the dielectric bars is best understood when one considers a traditional parallel plate capacitor having a solid as its dielectric, which is defined by:

$$C = \varepsilon_0 k (A/d)$$

where C is the capacitance of the capacitor (in Farads, F), $\varepsilon_0$ is the permittivity of air (i.e., $8.84 \times 10^{-12}$ Farads/meter), k is the dielectric constant of the dielectric material between the plates, A is the area of the metal plates (in square meters, $m^2$), and d is the distance between the two metal plates (in meters, m). As can be seen from the above equation, if the area of the metal plates (A) is reduced, then the resulting capacitance (C) is reduced. However, the reduction of capacitance C due to the reduction of area A is proportional, the proportion being equal to $\varepsilon_0 k/d$.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A fin-type field effect transistor (FinFET) structure comprising:
   a substrate having at least two fins thereon laterally spaced from one another;
   a metal gate over fin tops of the at least two fins and between sidewalls of upper portions of the at least two fins;
   source/drain regions in each fin on opposing sides of the metal gate;
   a dielectric bar within the metal gate located between the sidewalls of the upper portions of the at least two fins, the dielectric bar being laterally spaced away from the sidewalls of the upper portions of the at least two fins within the metal gate; and
   a gate cut isolation extending from a portion of a top surface of the metal gate to at least a portion of a top surface of the dielectric bar.

2. The FinFET structure of claim 1, further comprising a shallow trench isolation (STI) layer on a top surface of the substrate and between sidewalls of lower portions of the at least two fins.

3. The FinFET structure of claim 2, wherein the gate cut isolation extending to the top surface of the dielectric bar has a depth that is less than a distance from the top surface of the metal gate to a top surface of the STI layer.

4. The FinFET structure of claim 3, wherein the gate cut isolation extending from the top surface of the metal gate to the top surface of the dielectric bar has a width that is less than a width of another gate cut isolation extending from the top surface of the metal gate to the top surface of the STI layer.

5. The FinFET structure of claim 1, wherein a vertical cross-sectional area of the metal gate is reduced by an amount equal to a vertical cross-sectional area of the dielectric bar within the metal gate.

6. The FinFET structure of claim 5, wherein the FinFET structure has an effective capacitance that is reduced by an amount proportional to the vertical cross-sectional area of the dielectric bar within the metal gate.

7. The FinFET structure of claim 1, wherein the dielectric bar is laterally spaced away from a given sidewall of the upper portion of a given fin by a distance of approximately 3.5 nanometers (nm) to approximately 10 nanometers (nm).

8. An integrated circuit (IC) structure comprising:
   a first fin-type field effect transistor (FinFET) on a substrate, the first FinFET including an upper surface and pair of sidewalls above the substrate;
   a second FinFET on the substrate and laterally separated from the first FinFET, the second FinFET including an upper surface and pair of sidewalls above the substrate;
   a shallow trench isolation (STI) on the substrate between the first FinFET and the second FinFET, wherein the STI includes a first vertical sidewall contacting the first FinFET and a second opposing vertical sidewall contacting the second FinFET;
   a dielectric bar on an upper surface of the STI, the dielectric bar being laterally spaced away from the first FinFET and the second FinFET; and
   a gate cut isolation on an upper surface of the dielectric bar, wherein an upper surface of the gate cut isolation is substantially coplanar with a top surface of the first FinFET or the second FinFET.

9. The IC structure of claim 8, wherein each of the first FinFET and the second FinFET includes:
   a semiconductor fin on the substrate;
   a metal gate on the fin; and
   a pair of source/drain regions within the fin on opposing sides of the metal gate.

10. The IC structure of claim 9, wherein a vertical height of the gate cut isolation is less than a distance from a top surface of the metal gate to a top surface of the STI.

11. The IC structure of claim 8, wherein a vertical cross-sectional area of the dielectric bar is sized to reduce an effective capacitance of the first FinFET or the second FinFET.

12. The IC structure of claim 8, wherein the dielectric bar is laterally spaced away from each of the first FinFET and the second FinFET by a distance of approximately 3.5 nanometers (nm) to approximately 10 nanometers (nm).

13. An integrated circuit (IC) structure comprising:
   a first fin-type field effect transistor (FinFET) on a substrate, the first FinFET including an upper surface and pair of sidewalls above the substrate;
   a second FinFET on the substrate and laterally separated from the first FinFET, the second FinFET including an upper surface and pair of sidewalls above the substrate;
   a shallow trench isolation (STI) on the substrate between the first FinFET and the second FinFET, wherein the STI includes a first vertical sidewall contacting the first FinFET and a second opposing vertical sidewall contacting the second FinFET;
   a dielectric bar on an upper surface of the STI, the dielectric bar being laterally spaced away from the sidewalls of the first FinFET and the second FinFET; and
   a gate cut isolation on an upper surface of the dielectric bar, wherein an upper surface of the gate cut isolation is substantially coplanar with the upper surface of the first FinFET and the upper surface of the second FinFET.

14. The IC structure of claim 13, wherein each of the first FinFET and the second FinFET includes:
   a semiconductor fin on the substrate;
   a metal gate on the fin contacting a sidewall of the gate cut isolation, wherein an upper surface of each metal gate defines an upper surface of the first FinFET or the second FinFET; and a pair of source/drain regions within the fin on opposing sides of the metal gate.

15. The IC structure of claim 14, wherein a vertical cross-sectional area of the metal gate of the first FinFET or the second FinFET is reduced by an amount equal to a vertical cross-sectional area of the dielectric bar.

16. The IC structure of claim 15, wherein the first FinFET or the second FinFET has an effective capacitance that is reduced by an amount proportional to the vertical cross-sectional area of the dielectric bar.

17. The IC structure of claim 13, wherein the dielectric bar is laterally spaced away from each of the first FinFET and the second FinFET by a distance of approximately 3.5 nanometers (nm) to approximately 10 nanometers (nm).

* * * * *